United States Patent
Noehte et al.

(10) Patent No.: US 7,413,830 B2
(45) Date of Patent: *Aug. 19, 2008

(54) LITHOGRAPH WITH ONE-DIMENSIONAL TRIGGER MASK AND METHOD OF PRODUCING DIGITAL HOLOGRAMS IN A STORAGE MEDIUM

(75) Inventors: Steffen Noehte, Weinheim (DE); Christoph Dietrich, Heidelberg (DE); Robert Thomann, Heidelberg (DE); Matthias Gerspach, Heidelberg (DE); Jörn Leiber, Hamburg (DE); Stefan Stadler, Hamburg (DE)

(73) Assignee: Tesa Scribos GmbH, Heidelberg (DE)

( * ) Notice: Subject to any disclaimer, the term of this patent is extended or adjusted under 35 U.S.C. 154(b) by 640 days.

This patent is subject to a terminal disclaimer.

(21) Appl. No.: 10/474,613

(22) PCT Filed: Mar. 28, 2002

(86) PCT No.: PCT/EP02/03516

§ 371 (c)(1), (2), (4) Date: Jun. 30, 2004

(87) PCT Pub. No.: WO02/084404

PCT Pub. Date: Oct. 24, 2002

(65) Prior Publication Data

US 2004/0233490 A1 Nov. 25, 2004

(30) Foreign Application Priority Data

Apr. 12, 2001 (DE) .............................. 101 185 936
Aug. 2, 2001 (DE) .............................. 101 378 599

(51) Int. Cl.
*A61N 5/00* (2006.01)
*G03F 7/20* (2006.01)
*G03H 1/08* (2006.01)

(52) U.S. Cl. ..................... 430/1; 430/2; 359/35; 359/9

(58) Field of Classification Search ........................ None
See application file for complete search history.

(56) References Cited

U.S. PATENT DOCUMENTS 3,925,785 A 12/1975 Firlion (Continued)

FOREIGN PATENT DOCUMENTS

EP 0 947 884 10/1999

(Continued)

OTHER PUBLICATIONS

Langlois et al., 'Diffractive optical elements fabricated by direct laser writing and other techniques' Proc. SPIE vol. 1751., pp. 2-12 (1992).*

*Primary Examiner*—Martin J Angebranndt
(74) *Attorney, Agent, or Firm*—Proskauer Rose LLP

(57) ABSTRACT

The present invention relates to a method of producing digital holograms in a storage medium, in which the technical problem of writing computer-generated holograms by means of optical lithography as quickly as possible and with little effort with simultaneous accurate control of the timed triggering and the positioning of the write beam is achieved in that a write beam is focused onto the storage medium and moved one-dimensionally relative to the storage medium, in that a scanning beam is focused onto a trigger mask having a plurality of trigger lines and moved one-dimensionally transversely relative to the trigger lines, the movement of the scanning beam being coupled with the movement of the write beam, in that, during the scanning of the trigger lines, a timed trigger signal is generated as a function of the arrangement of the trigger lines, in that, with the aid of the timed trigger signal, the intensity of the write beam on the storage medium is controlled, and in that the hologram is written line by line by introducing radiation energy point by point, the storage medium being displaced transversely with respect to the scanning direction of the lines by a predefined distance to write adjacent lines of the hologram.

The technical problem is also solved by a lithograph for producing digital holograms.

32 Claims, 3 Drawing Sheets

U.S. PATENT DOCUMENTS

| | | | | |
|---|---|---|---|---|
| 4,312,590 A | * | 1/1982 | Harbaugh | 355/51 |
| 4,393,411 A | * | 7/1983 | Amtower | 358/302 |
| 4,688,932 A | | 8/1987 | Suzuki | |
| 5,289,407 A | * | 2/1994 | Strickler et al. | 365/106 |
| 5,617,500 A | * | 4/1997 | Shionoya et al. | 385/132 |
| 5,822,092 A | * | 10/1998 | Davis | 359/10 |
| 6,768,562 B1 | * | 7/2004 | Takada et al. | 358/296 |
| 7,123,340 B2 | * | 10/2006 | Noehte et al. | 355/2 |
| 2004/0136040 A1 | * | 7/2004 | Noehte et al. | 359/35 |
| 2004/0173761 A1 | * | 9/2004 | Noehte et al. | 250/492.1 |
| 2004/0257629 A1 | * | 12/2004 | Noehte et al. | 359/35 |

FOREIGN PATENT DOCUMENTS

| | | |
|---|---|---|
| EP | 0 950 924 | 10/1999 |
| EP | 0 965 888 | 12/1999 |

* cited by examiner

LITHOGRAPH WITH ONE-DIMENSIONAL TRIGGER MASK AND METHOD OF PRODUCING DIGITAL HOLOGRAMS IN A STORAGE MEDIUM

BACKGROUND OF THE INVENTION

The present invention relates to a lithograph for producing digital holograms in a storage medium. Furthermore, the invention relates to a method of producing digital holograms in a storage medium.

Digital holograms are two-dimensional holograms which consist of individual points with different optical properties and from which, when illuminated with a coherent electromagnetic wave, in particular a light wave, images and/or data are reproduced by means of diffraction in transmission or reflection. The different optical properties of the individual points can be reflective material properties, for example as a result of surface topography, varying optical path lengths in the material of the storage medium (refractive indices) or color values.

The optical properties of the individual points are calculated by a computer, what are known as computer-generated holograms (CGH) are thus involved. With the aid of the focused write beam, during the writing of the hologram, the individual points of the hologram are written into the material, the focus being located in the region of the surface or in the material of the storage medium. In the region of the focus, focusing has the effect of a small area of action on the material of the storage medium, so that a large number of points of the hologram can be written on a small area. The optical property of the respectively written point in this case depends on the intensity of the write beam. For this purpose, the write beam is scanned in two dimensions over the surface of the storage medium with varying intensity. The modulation of the intensity of the write beam is in this case carried out either via internal modulation of the light source, for example a laser diode, or via external modulation of a write beam outside the light source, for example with the aid of optoelectronic elements. Furthermore, the light source can be formed as a pulsed laser whose pulse lengths can be controlled, so that control of the intensity of the write beam can be carried out by the pulse lengths.

As a result of the scanning of the intensity-modulated write beam, an area with an irregular point distribution is thus produced, the digital hologram. This can be used to identify and individualize any desired objects.

Scanning lithographic systems are intrinsically widespread. For example, scanning optical systems are incorporated in conventional laser printers. However, these systems cannot be used for the production of holograms, since the requirements for this intended application differ considerably from those in laser printers. In the case of good printing systems, the resolution is around 2500 dpi while, in the production of holograms, a resolution of about 25 000 dpi is required. In addition, in digital holography, only comparatively small areas are written. These are, for example, 1 to 5 $mm^2$, other sizes also being possible. The accuracy of the write pattern in the case of a lithograph for the production of digital holograms of, for example, 1000×1000 points on an area of 1×1 $mm^2$ must be about ±0.1 mm in both orthogonal directions. Furthermore, the writing speed should be about 1 Mpixel/s, in order that in each case a hologram can be written in a time of about 1 s.

Digital holograms can be produced by means of conventional scanning methods, with which the angle of the incident beam is varied by stationary optics. For example, scanning mirror lithographs with galvanometer and/or polygonal scanners operate on this principle.

In all the scanning methods known hitherto, one disadvantage is that, in a lithograph of simple structure, no timed control of the write beam is possible which is capable of maintaining a predefined point pattern of the digital hologram at the writing speeds to be achieved.

The present invention is therefore based on the technical problem of writing computer-generated holograms by means of optical lithography as quickly as possible and with little effort with simultaneous accurate control of the timed triggering and the positioning of the write beam.

SUMMARY OF THE INVENTION

The technical problem indicated previously is achieved by a method of producing digital holograms in a storage medium, in which a write beam is focused onto the storage medium and moved one-dimensionally relative to the storage medium, in which a scanning beam is focused onto a trigger mask having a plurality of trigger lines and is moved one-dimensionally transversely relative to the trigger lines, the movement of the scanning beam being coupled with the movement of the write beam, in which, during the scanning of the trigger lines, a timed trigger signal is generated as a function of the arrangement of the trigger lines, in which, with the aid of the timed trigger signal, the intensity of the write beam on the storage medium is controlled, and in which the hologram is written line by line by introducing radiation energy point by point, the storage medium being displaced transversely with respect to the scanning direction of the lines by a predefined distance to write adjacent lines of the hologram.

One-dimensional movement in the sense of the present invention means a movement which extends substantially in one direction. A one-dimensional movement is therefore in particular a rectilinear movement, but a one-dimensional movement in the sense of the invention can also be along a curved line, that is to say deviating from a straight line.

According to the invention, it has been recognized that, with the aid of a scanning beam coupled in its movement to the write beam, a timed trigger signal can be generated with a one-dimensional trigger mask similar to a bar code. In this case, the trigger lines are preferably arranged in parallel, that is to say in an orthogonal pattern, but this is not absolutely necessary. With the aid of the timed trigger information and an additional item of intensity information which, in principle, can be generated independently of the trigger mask, the digital hologram can be written successively point by point in lines. Therefore, the movements of the write beam and the storage medium are coordinated with one another. Once a current line has been written, then for example the storage medium is displaced by a predefined distance, so that the further line can then be written. It is likewise possible to displace the storage medium continuously and to write the lines of the hologram into the material of the storage medium during the displacement of the storage medium transversely with respect to the scanning direction.

As explained previously, during the scanning of the trigger lines, a timed trigger signal is generated as a function of the arrangement of the trigger lines. In particular, the timed trigger signal can be generated when the scanning beam coincides with one of the trigger lines to be scanned. In this case, coincidence means either that reaching or leaving the trigger line or an arbitrary intermediate region between the trigger lines is measured as a threshold value of a beam reflected or transmitted by the trigger mask, or that the trigger mask has active elements which can generate the timed trigger signal at a predefined illumination intensity. This value is set within the measurement accuracy such that the control can be carried out at the required speed.

The scanning beam is preferably moved in a predefined movement relationship with the write beam. Thus, the scanning beam can scan a trigger mask whose area is greater than the region of the storage medium to be written. If the trigger mask is, for example, 10 times larger than the hologram to be produced, then the movement of the scanning beam is enlarged in the ratio 10:1 in proportion to the movement of the write beam. If, therefore, for example a hologram with an area of 1×1 $mm^2$ is to be written, the scanning beam scans a trigger mask with an area of 10×10 $mm^2$.

Furthermore, it is preferred for the scanning beam to be focused to a size which corresponds at most to the trigger line dimension of the trigger mask. This ensures that coincidence with the trigger line is sensed sufficiently accurately and a sufficiently accurate timed trigger signal can be generated.

The optical properties of the trigger lines can be formed in different ways, in each case use being made of techniques which are known per se from the prior art, in particular from optical storage media such as compact disc (CD) or digital versatile disc (DVD).

In a first embodiment, the trigger lines of the trigger mask have a reflectance differing from the surrounding surface laterally beside the trigger lines, so that the beam reflected from the surface of the trigger mask can be detected by a detector. The trigger signal is then derived from the intensity of the reflected scanning beam focused on the detector surface.

In a second embodiment, the trigger lines of the trigger mask have transmission properties differing from the surrounding surface laterally beside the trigger lines, so that the beam transmitted by the trigger mask can be detected by a detector. The trigger signal is then derived from the intensity of the transmitted beam measured in this way.

Sections with reflective and with transmissive properties can also be combined with one another in a trigger line.

In a third embodiment, the trigger lines on the trigger mask have a surface structure, for example in the form of grooves, so that the beam refractively diffracted at the surface of the trigger mask can be detected. The trigger signal is then derived from the intensity of the reflected beam, which results substantially from the superimposition of the zeroth and the two first orders of diffraction.

All the embodiments of the invention mentioned previously by way of example are based on the fact that the scanning beam is influenced by the optical properties of the trigger mask in such a way that the coincidence with a trigger line can be detected from this and may be converted into a control signal for controlling the intensity of the write beam.

A further configuration of the trigger mask consists in its having active pixels and thus being able to produce the timed trigger signal directly. By means of driving the pixels differently, it is thus also possible for different trigger tracks to be produced without replacing the trigger mask per se.

The active trigger mask used is preferably a spatial light modulator (SLM), with which a time-variably adjustable trigger mask can be implemented. According to a second teaching of the present invention, the technical problem listed above is solved by a lithograph having the features of claim 15.

The previously described functioning of the present invention and its preferred configurations can also advantageously be used in a scanning, in particular confocal, microscope. In a microscope of this type, the surface to be examined is scanned or observed with a light beam and the reflected light intensity is measured. During the scanning of the surface, the image is then assembled from the measured intensities of the reflected light. The surface is therefore scanned in a pattern, as has been described previously.

In the present case, for this purpose, a beam splitter is arranged in the beam path of the reflected beam, in front of or preferably behind the objective, in order to lead the reflected radiation to an optical sensor. The latter measures the reflected intensity.

With a microscope of this type, the technical problem of observing or scanning a surface as quickly as possible and with little effort is solved. This is in accordance with the technical problem on which the lithograph previously described is based. The advantages previously described for the lithograph are likewise achieved in a microscope of this type.

BRIEF DESCRIPTION OF THE DRAWINGS

In the following text the invention will be explained in more detail using exemplary embodiments and with reference to the appended drawing, in which.

DETAILED DESCRIPTION OF THE INVENTION

Figure 1:
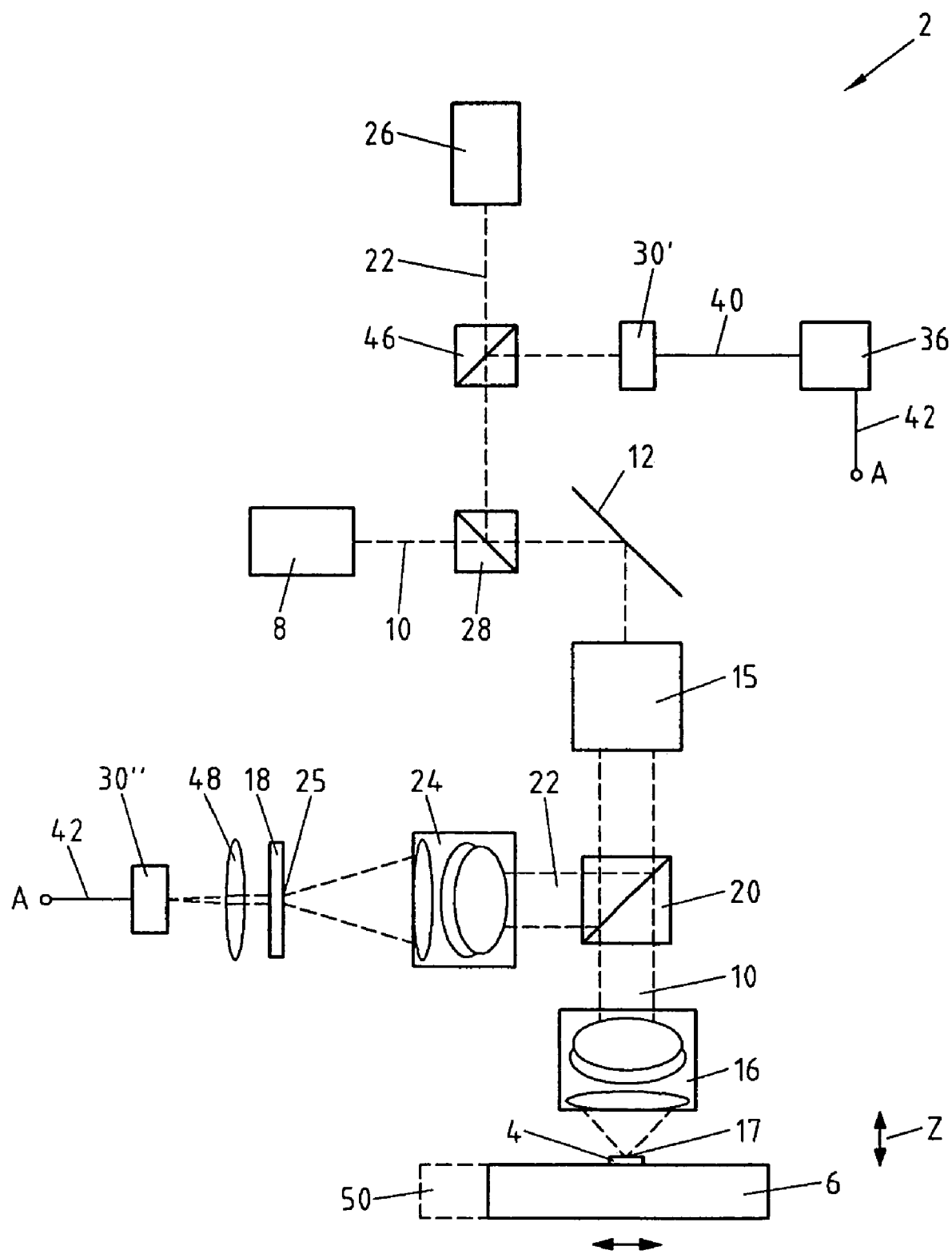
FIG. 1 shows an exemplary embodiment of a lithograph according to the invention.

FIG. 1 shows a first exemplary embodiment of a lithograph 2 according to the invention for producing digital holograms in a storage medium 4 which is arranged on a carrier 6. A light source 8 for producing a write beam 10 preferably has a laser or a laser diode, so that the write beam 10 is formed as a laser beam.

The lithograph 2 also has drive means for the one-dimensional movement of the write beam 10 relative to the storage medium 4, which are formed as a galvanometrically driven scanning mirror 12 and, for example, deflect the writing beam in the direction at right angles to the plane of the drawing of FIG. 1. The mirror 12 therefore constitutes an x-scanning mirror arrangement. Instead of the galvanometric scanning mirror 12, a rotatable polygonal mirror can also be used.

Optionally, a beam spreader or collimator 15 is also arranged in the beam path, behind the scanning mirror 12, in order to produce a widened write beam 10.

A first objective 16 focuses the write beam 10 onto the storage medium 4 to be written, so that, at the focus 17, depending on the focused intensity of the write beam 10, the optical property of the storage medium 4 is changed or remains unchanged.

According to the invention, a two-dimensional trigger mask 18 is provided, onto which a scanning beam 22 coupled out of the write beam 10 by a beam splitter 20 is focused at a focus 25 by a second objective 24.

The scanning beam 22 is produced by a second light source 26 and is coupled into the beam path of the write beam 10 in front of the first scanning mirror 12 by a beam splitter 28. The scanning beam 22 has a wavelength or polarization which differs from the write beam 10, so that the beam splitter 28 is formed as a dichroic or polarizing beam splitter. The beam splitter 20 is then correspondingly formed so as to be dichroic or polarizing, in order to couple the scanning beam 22 out of the common beam path.

The scanning beam 22 is therefore independent of the intensity modulation of the write beam 10, so that the latter can also be switched off, that is to say set with an intensity equal to zero.

On the other hand, it is also possible to couple the scanning beam 22 out of the write beam as a part beam without the scanning beam 22 having to be produced by a separate light source. The beam splitters 20 and 28 are then formed as partly transparent beam splitters.

The two objectives 16 and 24 in each case have three lenses of a focusing lens system. However, the precise configuration of the objectives 16 and 24 is unimportant. The objectives 16 and 24 can preferably be formed such that their angular deflections in the x direction depend linearly on each other, which produces linear coupling between the movements of the foci 17 and 25.

As emerges from the structure of the lithograph 2 according to FIG. 1, the drive means, that is to say the scanning mirror 12, do not drive just the write beam 10 but also the scanning beam 22. This is because the beam splitter 20 is arranged behind the scanning mirror 12 in the beam path of the write beam 10. Thus, the scanning beam 22 is moved one-dimensionally in the same way as the write beam 10, so that the scanning beam 22 is moved relative to the surface of the trigger mask 18. This results in the movement of the scanning beam 22 being coupled with the movement of the write beam 10.

Furthermore, a detector 30' or a detector 30" is provided, alternatively or additionally, to pick up the scanning beam 22 of which the intensity is varied by the optical properties of the respective trigger lines of the trigger mask 18. The two different positions are illustrated in FIG. 1. The functioning of the detectors 30' and 30" is similar and will be explained in more detail further below.

Furthermore, control means 36 are provided for generating a trigger signal, connected to the detectors 30' and/or 30". For this purpose, lines 40 and 42 (illustrated as interrupted at the points A in FIG. 1) are provided. The timed trigger signal is then generated in accordance with the signals from the detectors.

Furthermore, the control means 36 generate an intensity control signal, which is transmitted to the light source 8 via a line, not illustrated, in order to control the intensity of the write beam 10. The control means 36 are formed as a computer. By means of the intensity control signal that is transmitted, the write beam 10 is modulated as a function of the position of the focus 25 of the scanning beam 22 on the trigger mask 18, which is coupled with the position of the focus 17 of the write beam 10 on the storage medium 4.

In other words, the write beam 10 is set to write hologram points with two or more different intensity values. In the case of binary writing, the intensity is switched to and fro between two different values, depending on whether a point is to be written or not. Likewise, writing hologram points with a gray value graduation is possible and practical.

If, however, as was described above, the scanning beam 22 is coupled out of the write beam 10 as a part beam without a separate light source being required, then, in order to register the focus 25 on the trigger mask 18, however, it is necessary for the lower or lowest intensity value of the write beam 10 not to be equal to zero. This ensures that the scanning beam 22 always has a minimum intensity for the generation of a trigger signal.

Furthermore, in the case of the structure of the lithograph 2 illustrated in FIG. 1, a length-related transmission ratio between the movement of the write beam 10 on the storage medium 4 and the scanning beam 22 on the trigger mask 18 is predefined. This is implemented by means of different focal lengths of the two objectives 16 and 26. If, for example, the focal length of the first objective 16 is smaller by a factor 10 than the focal length of the second objective 24, then the movement of the focus 25 of the scanning beam 22 on the trigger mask 18 is greater by the same factor 10 times than the movement of the focus 17 on the surface of the storage medium 4. In FIG. 1, only a focal length ratio of about 2 is illustrated, for reasons of space. However, this illustrates that a specific ratio is unimportant in the present configuration of the invention.

Furthermore, the carrier 6 is connected to a drive 50, illustrated schematically, which displaces the storage medium step by step between two lines of the hologram to be written in each case. The direction of the displacement is illustrated by a double arrow in FIG. 1 and runs horizontally in the plane of the drawing of FIG. 1. As a result, it is possible to write the lines of the hologram in an orthogonal pattern. In addition, the drive can also displace the carrier 6 continuously, so that the lines are written in a pattern which is not orthogonal if the storage medium 4 is moved during the scanning with the aid of the scanning mirror 12.

Figure 2:
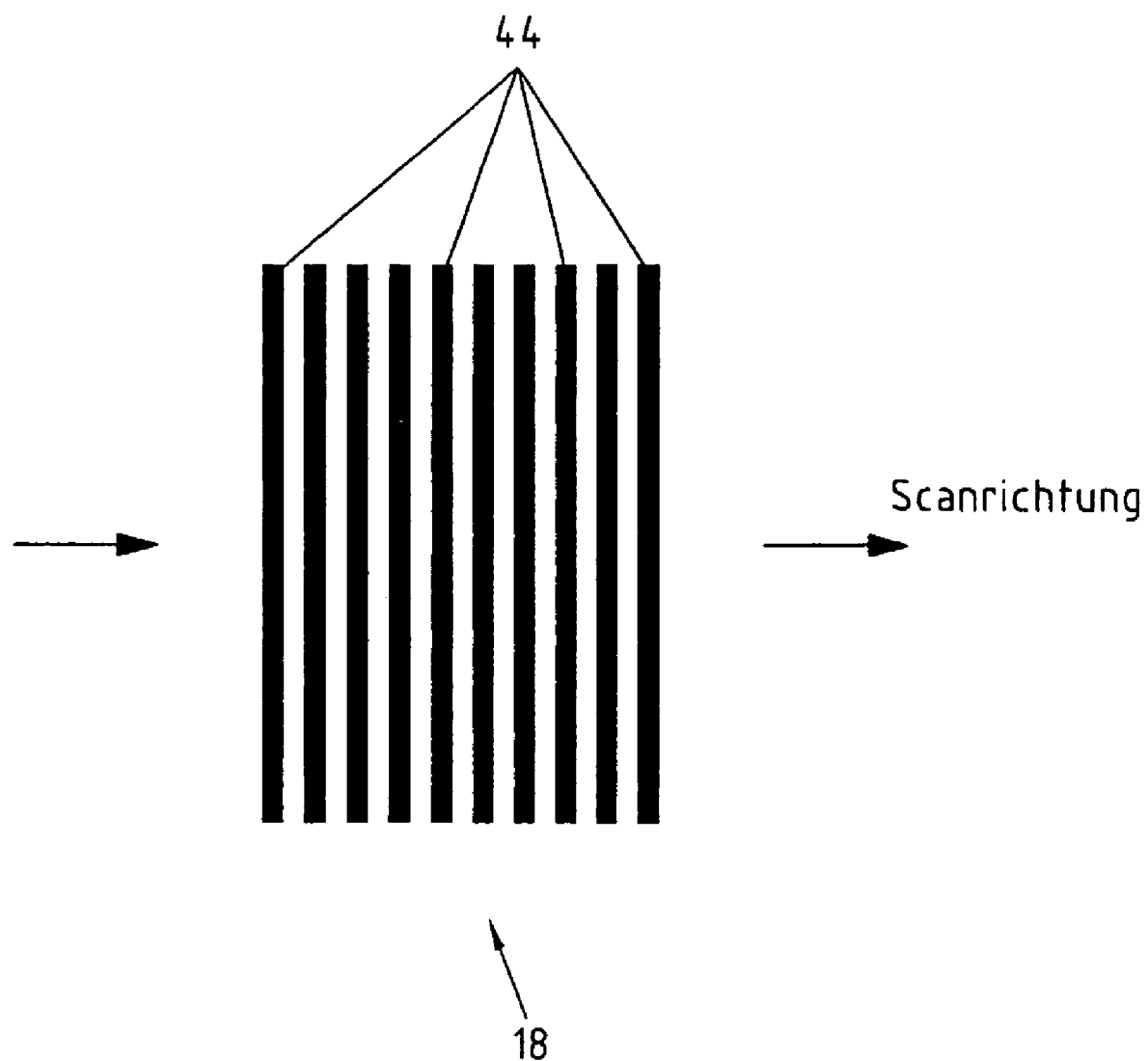
FIG. 2 shows an exemplary embodiment of a trigger mask.

As FIG. 2 shows, the trigger mask 18 has a plurality of trigger lines 44. These are arranged in an orthogonal pattern and have substantially identical spacings from one another. In quite general terms, however, the trigger lines 44 can be present in a predefined arrangement in which the trigger lines even have a form which runs arbitrarily, therefore also curved, and have varying spacings from one another. This is because the arrangement of the trigger lines 44 reproduces the point pattern of the digital hologram to be written.

The scanning beam scans the trigger lines transversely, preferably at right angles to their course, similar to the case when registering a bar code. Because of the elongated extent of the trigger lines 44, accurate adjustment of the scanning beam 22 on the trigger mask 18 is therefore not important. At the start and/or at the end of the trigger lines 44, it is preferable for specific codes to be formed in the scanning direction, which make it possible for a start and/or an end signal to be generated from the beam influenced by the trigger mask. In this case, the codes can, for example, be contained in trigger lines of different widths, similar to the case of a bar code.

The trigger mask 18 can have a surface with different reflective properties. For this purpose, the trigger mask 18 is to some extent provided with a reflective layer. Likewise, the different reflective properties can be formed as different colorations of the material of the trigger mask. Likewise, different refractive properties of the material can effect the different reflective properties. Finally, the trigger mask can be formed as a spatial light modulator (SLM). As a result, a time-variable trigger mask is advantageously implemented.

Furthermore, the trigger mask 18 can have a surface with a topographical surface structure, at which the scanning beam 22 is reflected diffractively.

For both configurations of the beam guide mask, which reflects the scanning beam in the direction back to the light source 26, an output beam coupler 46 is provided in the beam path of the scanning beam 22, in front of the scanning mirror 12 in the beam direction. Said coupler leads the reflected scanning beam 22 to the detector 30'. There, the detection signal is generated as the control signal for the control means 36.

Furthermore, the trigger mask 18 can have a surface with different transmission properties. The scanning beam 22 is therefore let through at different intensities. The proportion of the scanning beam 22 that is let through is focused by optics 48 onto the surface of the detector 30". There, the control signal for the control means 36 is then generated and is transmitted via the line 42.

In this case, too, the material of the trigger mask 18 can be formed in different ways. The different transmission properties can be produced by different colorations of the intrinsically translucent material. However, in this case, too, the trigger mask 18 can be formed as a spatial light modulator (SLM). As a result, a time-variable transmitting trigger mask is advantageously implemented.

The control means 36 for generating a timed trigger signal have computer means which are connected to the detectors 30' and/or 30". Said means compare the signal picked up by the detectors with desired values, so that the control signal for the intensity control is generated.

The control means 36 can likewise be used to generate an intensity control signal. For this purpose, the control means 36 have storage means, in which intensity values relating to the predefined positions along the tracks 44 are stored, are in each case read out and used to control the intensity of the light source 8.

A further feature of the configurations previously described of the lithograph is that the distance between the storage medium 4 and the objective 16 in FIG. 1 can be adjusted variably. This is identified by a double arrow designated "Z". For an adjustment of the distance in the z direction, means not illustrated in the Figures are provided. These can be any linear adjusting means which can be driven by motor or by hand. By means of adjusting the distance, the position of the focus in the storage medium 4 can be arranged at various depths; likewise adjustment of the focus with storage media 4 of different thicknesses is possible. Finally, at least two digital holograms can be written into different planes within the storage medium 4, in order to produce what are known as multilayer holograms.

Figure 3:
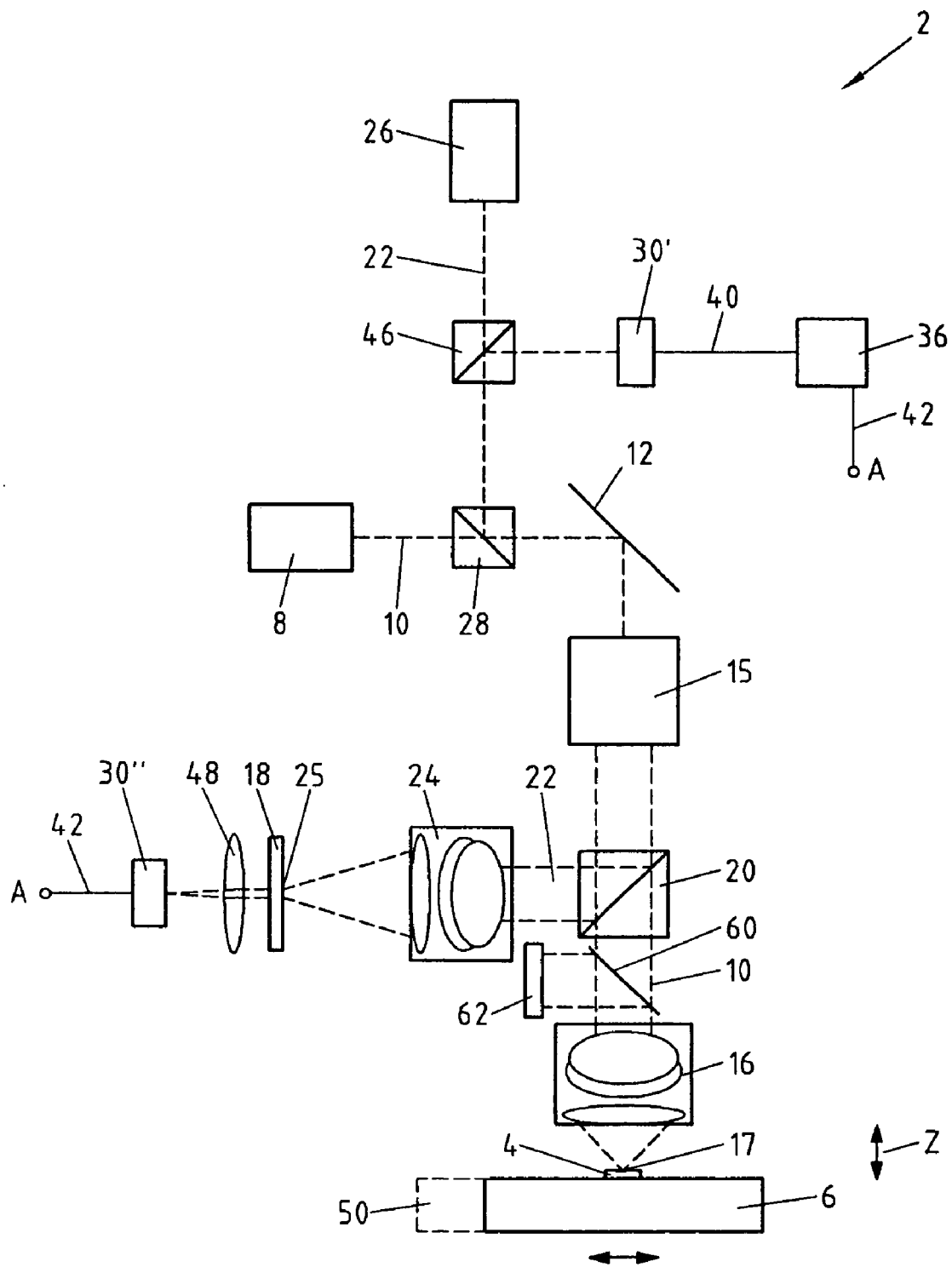
FIG. 3 shows a microscope according to the invention with a structure which corresponds substantially to the structure of the lithograph illustrated in FIG. 1.

FIG. 3 illustrates a microscope according to the invention which, in its structure, corresponds to the lithograph illustrated in FIG. 1. Therefore, identical designations designate identical components to those as have been described in connection with FIG. 1, even if, in detail, other designations are used which identify the difference between writing and observing.

In addition to the structure illustrated in FIG. 1, a deflection plane 60 is arranged in the beam path of the light reflected from the surface, behind, that is to say above, the objective 16. This can be implemented by means of a semitransparent mirror or a beam splitter and has no influence or only an insignificant influence on the observation beam.

The deflection plane 60 deflects the reflected beam laterally, to the left in FIG. 7, so that it strikes a photosensor 62 which measures the intensity of the reflected light.

By varying the observation beam 10 relative to the object 4 to be viewed under the microscope, the surface is then scanned and the reflectance is measured point by point. An image of the scanned surface can thus be assembled.

If, then, the light beam emitted by the light source 8, which can be designated an observation beam in the microscope, is produced with a substantially identical intensity, then the measured intensity of the reflected beam is a measure of the reflectance of the scanned surface.

The invention claimed is:

1. A method of producing digital holograms in a storage medium, wherein
    a write beam is focused onto the storage medium and moved one-dimensionally relative to the storage medium,
    a scanning beam is focused onto a trigger mask having a plurality of trigger lines and moved one-dimensionally transversely relative to the trigger lines, the movement of the scanning beam being coupled with the movement of the write beam and wherein the scanning beam is coupled out so it is not incident upon the storage medium,
    during the scanning of the trigger lines, a timed trigger signal is generated as a function of the arrangement of the trigger lines,
    with the aid of the timed trigger signal, the intensity of the write beam on the storage medium is controlled, and
    the hologram is written line by line by introducing radiation energy point by point, the storage medium being displaced transversely with respect to the scanning direction of the lines by a predefined distance to write adjacent lines of the hologram.

2. The method as claimed in claim 1, wherein the trigger lines are arranged in parallel, preferably in an orthogonal pattern.

3. The method as claimed in claim 1 wherein with the aid of the timed trigger information and an additional item of intensity information, the digital hologram is written successively point by the point in lines.

4. The method as claimed in claim 3, wherein the intensity information is generated independently of the trigger mask.

5. The method as claimed in claim 1, wherein the storage medium is kept unchanged with respect to the write beam as a line is written and is moved by the spacing of one line during a line change of the write beam.

6. The method as claimed in claim 1, wherein the storage medium is displaced continuously during the writing.

7. The method as claimed in claim 1, wherein the scanning beam is moved in a predefined movement relationship with the write beam.

8. The method as claimed in claim 1, wherein the scanning beam is focused to a size which corresponds at most to the trigger line dimension of the trigger mask.

9. The method as claimed in claim 1, wherein the trigger lines of the trigger mask have a reflectance differing from the surrounding surface laterally beside the trigger lines, and in which the trigger signal is derived from the intensity of the beam reflected from the surface of the trigger mask.

10. The method as claimed in claim 1, wherein the trigger lines of the trigger mask have a transmission property differing from the surrounding surface laterally beside the trigger lines, and in which the trigger signal is derived from the intensity of the beam transmitted through the trigger mask.

11. The method as claimed in claim 1, wherein the trigger lines of the trigger mask have a surface structure, for example in the form of grooves, and in which the trigger signal is derived from the intensity of the beam reflectively diffracted at the surface of the trigger mask.

12. The method as claimed in claim 1, wherein the trigger mask has active pixels and in which the timed trigger signal is generated directly by the active pixels.

13. The method as claimed in claim 12, wherein the active trigger mask used is a spatial light modulator.

14. The method as claimed in claim 1, wherein the distance between the objective and the storage medium is adjusted for writing at different depths within the storage medium.

15. A lithograph for producing digital holograms in a storage medium in particular for implementing a method as claimed in claim 1,
   having a light source for producing a write beam,
   having drive means for the one-dimensional movement of the write beam relative to the storage medium and
   having a first objective for focusing the write beam onto the storage medium to be written, wherein
   a trigger mask having a plurality of trigger lines is provided,
   means of producing a scanning beam are provided, wherein the scanning beam is coupled out so it is not incident upon the storage medium,
   a second objective for focusing the scanning beam onto the trigger mask is provided,
   the drive means move the scanning beam relative to the surface of the trigger mask, the movement of the scanning beam being coupled with the movement of the write beam,
   a detector is provided to pick up the scanning beam whose intensity is varied by the optical properties of the trigger lines,
   control means for generating a trigger signal as a function of the signal from the detector.

16. The lithograph as claimed in claim 15, wherein the control means are also provided to generate a signal for controlling the intensity of the write beam.

17. The lithograph as claimed in claim 15, wherein
   the drive means are formed as an x/y scanning mirror arrangement for moving the write beam and
   the means of producing the scanning beam have means for coupling out part of the write beam as a scanning beam in the beam path of the write beam behind the drive means.

18. The lithograph as claimed in claim 17, wherein the means of producing the scanning beam
   have a second light source for producing a scanning beam with a wavelength or polarization differing from the write beam and
   input coupling means for coupling the scanning beam into the beam path of the write beam in front of the drive means and
   the output coupling means couple out the scanning beam.

19. The lithograph as claimed in claim 15, wherein means for moving the storage medium relative to the write beam are provided.

20. The lithograph as claimed in claim 15, wherein a length-based step-up ratio between the movement of the scanning beam on the trigger mask and of the write beam on the storage medium is provided.

21. The lithograph as claimed in claim 20, wherein the focal length of the second objective is greater by a predefined factor than the focal length of the first objective.

22. The lithograph as claimed in claim 15, wherein the trigger mask has a plurality of trigger lines.

23. The lithograph as claimed in claim 22, wherein the trigger lines are arranged in a pattern, in particular an orthogonal pattern.

24. The lithograph as claimed in claim 15, wherein the trigger mask has a surface with different reflective properties.

25. The lithograph as claimed in claim 24, wherein the trigger mask is formed as a spatial light modulator.

26. The lithograph as claimed in claim 15, wherein the trigger mask has a surface with a topographical surface structure, at which the scanning beam is reflected.

27. The lithograph as claimed in claim 15, wherein the trigger mask has a surface with different transmission properties.

28. The lithograph as claimed in claim 27, wherein the trigger mask is formed as a spatial light modulator.

29. The lithograph as claimed in claim 27, wherein focusing optics for focusing the transmitted radiation onto the detector are provided.

30. The lithograph as claimed in claim 15, wherein means are provided for adjusting the distance between the storage medium and the objective.

31. A lithograph as in claim 15, wherein the lithograph is a microscope.

32. A microscope for scanning an object,
   having a light source for producing a scanning beam, wherein the scanning beam is coupled out so it is not incident upon the object,
   having drive means for the one-dimensional movement of the scanning beam relative to the object and
   having a first objective for focusing the scanning beam onto the object, wherein
   a trigger mask having a plurality of trigger lines is provided,
   means of producing a scanning beam are provided,
   a second objective for focusing the scanning beam onto the trigger mask is provided,
   the drive means move the scanning beam relative to the surface of the trigger mask, the movement of the scanning beam being coupled with the movement of the scanning beam,
   a detector is provided to pick up the scanning beam whose intensity is varied by the optical properties of the trigger lines, and
   control means for producing a trigger signal as a function of the signal from the detector.

* * * * *